(12) United States Patent
Masuda et al.

(10) Patent No.: US 7,462,436 B2
(45) Date of Patent: Dec. 9, 2008

(54) POSITIVE PHOTORESIST COMPOSITION AND METHOD OF FORMING RESIST PATTERN

(75) Inventors: Yasuo Masuda, Kanagawa-ken (JP); Toshiki Okui, Kanagawa-ken (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 83 days.

(21) Appl. No.: 10/564,510

(22) PCT Filed: Jul. 13, 2004

(86) PCT No.: PCT/JP2004/010270

§ 371 (c)(1),
(2), (4) Date: Jan. 12, 2006

(87) PCT Pub. No.: WO2005/007719

PCT Pub. Date: Jan. 27, 2005

(65) Prior Publication Data

US 2006/0210914 A1 Sep. 21, 2006

(30) Foreign Application Priority Data

Jul. 16, 2003 (JP) ............... 2003-197873
Jul. 16, 2003 (JP) ............... 2003-197874

(51) Int. Cl.
G03F 7/023 (2006.01)
G03F 7/30 (2006.01)

(52) U.S. Cl. ............ 430/190; 430/191; 430/192; 430/193; 430/326

(58) Field of Classification Search ........... 430/190, 430/191, 192, 193, 326
See application file for complete search history.

(56) References Cited

U.S. PATENT DOCUMENTS

| | | | |
|---|---|---|---|
| 5,290,657 A | 3/1994 | Uetani et al. | |
| 5,424,167 A | 6/1995 | Uetani et al. | |
| 5,683,851 A | 11/1997 | Tan et al. | |
| 6,187,500 B1 | 2/2001 | Miyagi et al. | |
| 6,210,855 B1 * | 4/2001 | Ueda et al. ............ | 430/190 |
| 6,265,129 B1 | 7/2001 | Takahashi et al. | |
| 6,274,287 B1 | 8/2001 | Moriuma et al. | |
| 6,319,853 B1 | 11/2001 | Ishibashi et al. | |
| 6,566,031 B1 | 5/2003 | Suzuki et al. | |
| 2002/0012865 A1 | 1/2002 | Suzuki et al. | |
| 2002/0182531 A1 | 12/2002 | Mizuta et al. | |

FOREIGN PATENT DOCUMENTS

| | | |
|---|---|---|
| EP | 0 598 320 A2 | 5/1994 |
| EP | 0 650 091 A1 | 4/1995 |
| EP | 0 677 789 A1 | 10/1995 |
| JP | 3-191351 | 8/1991 |
| JP | 5-232697 | 9/1993 |
| JP | 06-003815 | 1/1994 |
| JP | 07-159990 | 6/1995 |
| JP | 10-069077 | 3/1998 |
| JP | 10-97066 | 4/1998 |
| JP | 10-153857 | 6/1998 |
| JP | 10-232492 | 9/1998 |
| JP | 11-204399 | 7/1999 |
| JP | 2001075272 | 3/2001 |
| JP | 2001-312052 | 11/2001 |
| JP | 2001-312059 | 11/2001 |
| JP | 2001-312060 | 11/2001 |
| JP | 2001-312066 | 11/2001 |

OTHER PUBLICATIONS

Office Action dated Oct. 24, 2006 for counterpart Japanese Patent Application No. 2003-197873.
Office Action dated Oct. 31, 2006 for counterpart Japanese Patent Application No. 2003-197874.
Office Action issued on Jun. 12, 2007, in connection with Japanese Patent Application No. 2003-197873.

* cited by examiner

Primary Examiner—John S Chu
(74) Attorney, Agent, or Firm—Knobbe, Martens, Olson & Bear LLP

(57) ABSTRACT

There is provided a positive photoresist composition capable of forming a pattern with excellent resolution, excellent resistance to reflection off the substrate, and excellent perpendicularity. The positive photoresist composition comprises (A) an alkali-soluble novolak resin in which a portion of the hydrogen atoms of all the phenolic hydroxyl groups are substituted with 1,2-naphthoquinonediazidesulfonyl groups, and (B) a dissolution promoter represented by a general formula (b-1) and/or a general formula (b-11) shown below.

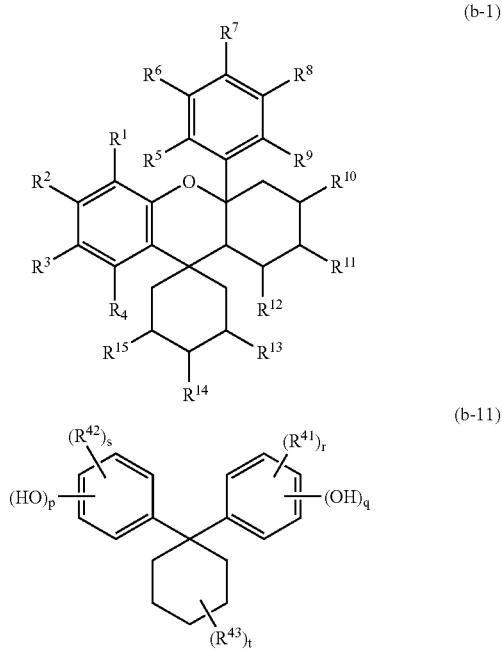

9 Claims, 1 Drawing Sheet

POSITIVE PHOTORESIST COMPOSITION AND METHOD OF FORMING RESIST PATTERN

This application is the U.S. National Phase under 35 U.S.C. §371 of International Application PCT/JP2004/010270, filed Jul. 13, 2004, which claims priority to Japanese Patent Application No. 2003-197873, filed Jul. 16, 2003 and Japanese Patent Application 2003-197874, filed Jul. 16, 2003. The International Application was published under PCT Article 21(2) in a language other than English.

TECHNICAL FIELD

The present invention relates to positive photoresist composition and a method of forming a resist pattern.

BACKGROUND ART

Conventionally, photolithography techniques that use i-line radiation (365 nm) use mainly positive photoresist compositions comprising an alkali-soluble resin and a quinonediazide group containing compound as a photosensitizer in the production of semiconductor elements and liquid crystal elements and the like. These positive photoresist compositions display the type of characteristics required to be equal to actual use within the fields of semiconductor element or liquid crystal element production. However, in fields that require a thick film process, for example, fields relating to magnetic heads such as giant magnetoresistive (GMR) heads or magnetoresistive (MR) heads, and particularly in the formation of the upper pole of a recording head (a magnetic head), a space pattern with a high aspect ratio must be able to be formed with good perpendicularity under thick film conditions of at least 3 μm, and formation of a resist pattern with good perpendicularity under such thick film conditions using a conventional i-line positive photoresist composition is difficult.

On the other hand, the addition of dissolution promoters (low molecular weight compounds with a phenolic hydroxyl group) to positive photoresist compositions has also been proposed. For example, the patent reference 1 discloses a positive resist composition comprising an alkali-soluble resin, a quinonediazide compound as a radiation sensitive component, and a specific compound with a phenolic hydroxyl group. Furthermore, the patent reference 2 discloses a positive photoresist composition comprising an alkali-soluble novolak resin with reduced quantities of the components with a molecular weight of less than 1000, a quinonediazide compound, and a specific compound with a phenolic hydroxyl group. However with these resist compositions, formation of a pattern with excellent resolution and good perpendicularity under thick film conditions of at least 3 μm is difficult.

Furthermore, the patent references 3 to 6 disclose positive photoresist compositions comprising an alkali-soluble novolak resin in which a portion of the hydrogen atoms of all the phenolic hydroxyl groups have been substituted with 1,2-naphthoquinonediazidesulfonyl groups as materials suitable for exposure processes under thick film conditions.

However, according to investigations conducted by the inventors of the present invention, resist compositions of this type containing an added dissolution promoter such as a typical tris-phenol based dissolution promoter suffer from a marked deterioration in heat resistance, or an inability to achieve an inadequate exposure margin, making the control of dimensions relative to the exposure dose difficult. Furthermore, these dissolution promoters do not display an entirely satisfactory dissolution promotion effect, making it impossible to achieve a satisfactory developing rate.

(Patent Reference 1)
Japanese Patent (Granted) Publication No. 2,629,990
(Patent Reference 2)
Japanese Patent (Granted) Publication No. 3,391,471
(Patent Reference 3)
Japanese Unexamined Patent Application, First Publication No. 2001-312052
(Patent Reference 4)
Japanese Unexamined Patent Application, First Publication No. 2001-312059
(Patent Reference 5)
Japanese Unexamined Patent Application, First Publication No. 2001-312060
(Patent Reference 6)
Japanese Unexamined Patent Application, First Publication No. 2001-312066

DISCLOSURE OF INVENTION

Accordingly, an object of the present invention is to provide a positive photoresist composition, which when used for forming a resist pattern on a substrate under thick film conditions of at least 3 μm, is capable of forming a pattern with excellent resolution, excellent resistance to deterioration of the resist pattern caused by reflection of the exposure light off a substrate with level differences, and excellent perpendicularity of the cross sectional shape of the side walls of the resist pattern (hereafter, sometimes referred to simply as "perpendicularity"), as well as superior levels of heat resistance and solubility, or a large exposure margin, and also to provide a method of forming a resist pattern.

As a result of intensive research, the inventors of the present invention discovered that a positive photoresist composition comprising a specific alkali-soluble novolak resin and a specific dissolution promoter was able to achieve the above object, and were hence able to complete the present invention.

In other words, the present invention provides a positive photoresist composition comprising (A) an alkali-soluble novolak resin in which a portion of the hydrogen atoms of all the phenolic hydroxyl groups are substituted with 1,2-naphthoquinonediazidesulfonyl groups, and (B) a dissolution promoter comprising at least one compound selected from a group consisting of compounds represented by the general formula (b-1) and the general formula (b-11) shown below.

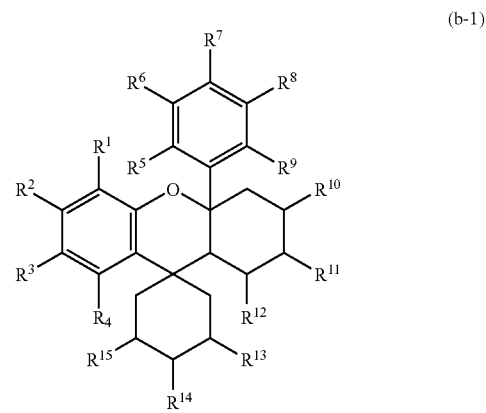

wherein, $R^1$ to $R^9$ each represent, independently, a hydrogen atom, an alkyl group, a halogen atom, or a hydroxyl group, although at least one of $R^1$ to $R^9$ represents a hydroxyl group; and $R^{10}$ to $R^{15}$ each represent, independently, a hydrogen atom, an alkyl group, an alkenyl group, a cycloalkyl group or an aryl group.

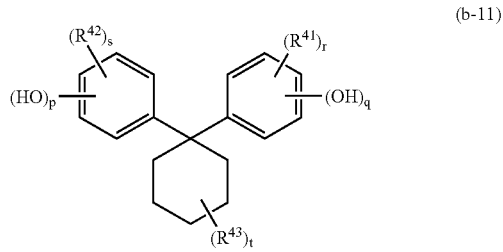

(b-11)

wherein, $R^{41}$ to $R^{43}$ each represent, independently, a lower alkyl group, a cycloalkyl group or a lower alkoxy group; p and q each represent an integer from 1 to 3; and r, s and t each represent either 0, or an integer from 1 to 3.

In the present invention, the aforementioned component (A) is preferably a fractionated resin in which fractionation treatment has been used to reduce the lower molecular weight fraction to no more than 80% by weight of the value prior to fractionation.

A positive photoresist composition of the present invention preferably also comprises a photosensitizer (C), in accordance with the thickness of the resist pattern film that is to be formed.

A positive photoresist composition of the present invention preferably comprises both (b-1) and (b-11) as dissolution promoters.

Furthermore, the present invention also provides a method of forming a resist pattern comprising the steps of applying the positive photoresist composition described above to a substrate, conducting a prebake, performing selective exposure, and then performing alkali developing to form the resist pattern.

BEST MODE FOR CARRYING OUT THE INVENTION

Figure 1:
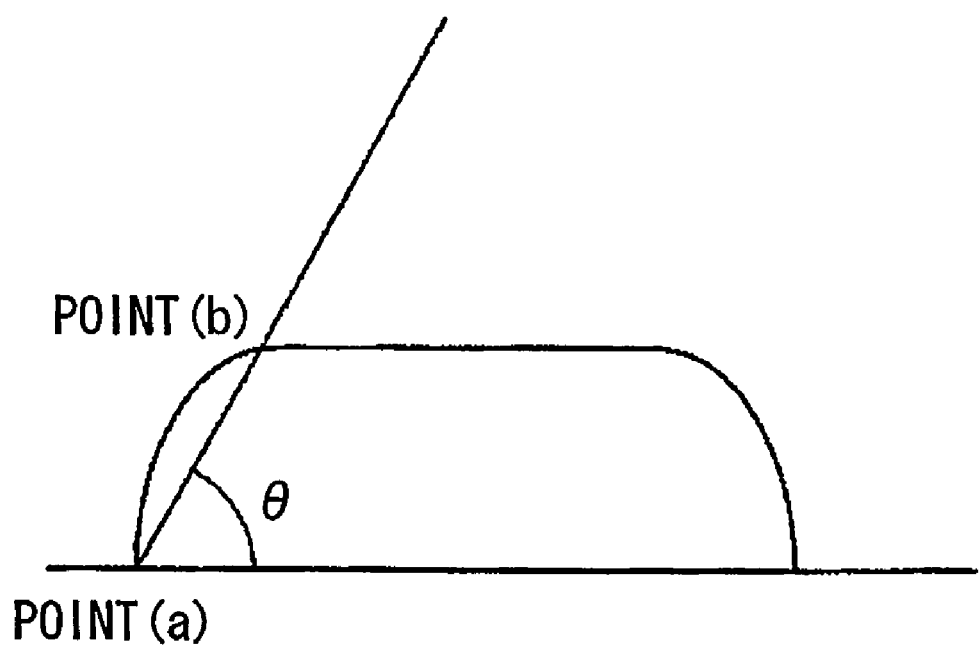
FIG. 1 is a diagram describing the angle θ between a substrate interface and a straight line connecting the point of intersection (point a) between the substrate interface and a side wall of a resist pattern, and the corner (point b) at the top of the resist pattern.

As follows is a more detailed description of the present invention.

(Positive Photoresist Composition)

A positive photoresist composition of the present invention comprises a component (A) and a component (B). By combining the component (B) with the component (A), a pattern with excellent resolution and perpendicularity can be formed when a resist pattern is formed on a substrate under thick film conditions of at least 3 μm. In addition, by combining the component (B) with the component (A), either a positive photoresist composition with superior levels of heat resistance and solubility is obtained, or a large exposure margin is achieved when using the composition to form a resist pattern, thus making the control of dimensions relative to the exposure dose considerably easier.

<Component (A)>

The component (A) is an alkali-soluble novolak resin in which a portion of the hydrogen atoms of all the phenolic hydroxyl groups are substituted with 1,2-naphthoquinonediazidesulfonyl groups.

The component (A) can be synthesized by normal methods, such as the method disclosed in Japanese Unexamined Patent Application, First Publication No. H 10-97066, wherein the product of a condensation polymerization, synthesized by a dehydration condensation reaction between a phenol compound and a condensing agent, undergoes a esterification reaction with a 1,2-naphthoquinonediazidesulfonic acid compound.

Examples of 1,2-naphthoquinonediazidesulfonic acid compounds that can be used include halides of quinonediazide compounds such as 1,2-naphthoquinonediazide-4-sulfonyl chloride and 1,2-naphthoquinonediazide-5-sulfonyl chloride.

Examples of the aforementioned phenol compound include phenol compounds corresponding with the structural units represented by the formulas (a-1) to (a-5) shown below.

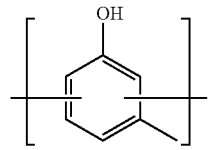

(a-1)

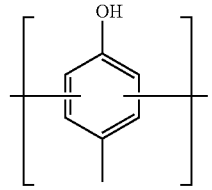

(a-2)

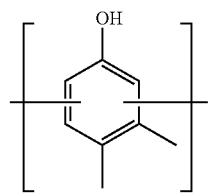

(a-3)

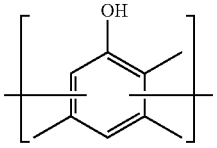

(a-4)

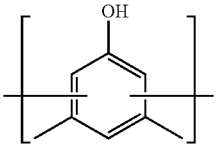

(a-5)

An example of a phenol compound corresponding with the structural unit represented by the above general formula (a-1) is m-cresol, an example of a phenol compound corresponding with the structural unit represented by the above general formula (a-2) is p-cresol, an example of a phenol compound corresponding with the structural unit represented by the above general formula (a-3) is 3,4-xylenol, an example of a phenol compound corresponding with the structural unit represented by the above general formula (a-4) is 2,3,5-trimethylphenol, and an example of a phenol compound corresponding with the structural unit represented by the above general formula (a-5) is 3,5-xylenol.

Furthermore, phenols other than those described above can also be used, although restricting the proportion of such other phenol compounds to no more than 10 mol % of the total phenol content is preferred in terms of avoiding any deterioration in the characteristics of the positive photoresist composition of the present invention.

Examples of the condensing agent include the types of aldehydes and ketones used in conventional syntheses of phenol novolak resins, and of these, aldehydes, and particularly formaldehyde, are preferred.

The polystyrene equivalent weight average molecular weight (Mw) of the component (A) as determined by gel permeation chromatography (GPC) is preferably within a range from 1000 to 50,000, and even more preferably from 2000 to 20,000. If Mw is less than 1000, then marked film thinning of the unexposed portions occurs during developing, making the formation of a resist pattern far more difficult. In contrast, if the Mw exceeds 50,000, the developing rate and the resolution tend to worsen markedly.

Furthermore, the component (A) is preferably a fractionated resin in which fractionation treatment has been used to reduce the lower molecular weight fraction to no more than 80% by weight, and preferably no more than 50% by weight, of the value prior to fractionation.

This low molecular weight fraction refers to phenol compounds such as those described above, namely phenol based monomers, as well as dimers formed from two molecules of such phenol based monomers, and trimers obtained from three molecules of such phenol based monomers.

By using this type of fractionated resin, the perpendicularity of the cross sectional shape of the resist pattern improves even further, the generation of residue (scum) on the substrate surface following developing becomes less, and the resolution improves. Furthermore, the heat resistance also tends to be superior, all of which are desirable properties.

The fractionation treatment can be conducted using a known fractionation treatment method, and one suitable example is the fractional precipitation treatment described below. First, as described above, a dehydration condensation reaction is conducted between a phenol compound and a condensing agent, and the resulting condensation polymerization product (novolak resin) is then dissolved in a polar solvent, and a poor solvent such as water, heptane, hexane, pentane or cyclohexane is then added to the solution. In this process, because the low molecular weight materials display a comparatively higher level of solubility, they remain dissolved even after addition of the poor solvent. Consequently, by filtering off the precipitated material, a fractionated resin with a reduced low molecular weight fraction can be obtained.

Examples of the above polar solvent include alcohols such as methanol and ethanol, ketones such as acetone and methyl ethyl ketone, glycol ether esters such as ethylene glycol monoethyl ether acetate, and cyclic ethers such as tetrahydrofuran.

The content of low molecular weight materials within the component (A) can be confirmed from the results of GPC measurements. In other words, the GPC chart enables the molecular weight distribution to be determined for the synthesized phenol novolak resin, and by measuring the variation in the intensity of the peak corresponding with the elution time for the low molecular weight materials, the content of these materials can be calculated. Because the elution time of the low molecular weight materials varies depending on the measurement system employed, specifying factors such as the column, eluent, flow rate, temperature, detector, sample concentration, injection volume and measuring device is important. In the present invention, by using the measurement system described below, the elution time for phenol based monomers is in the vicinity of 23 to 25 minutes, the elution time for dimers is approximately 22 minutes, and the elution time for trimers is in the vicinity of 21 minutes, enabling each peak to be assigned.

[GPC Measurement System for the Present Invention]
(1) 20 mg of a sample is dissolved in 10 ml of tetrahydrofuran (THF) to prepare a sample solution.
(2) 10 μl of the sample solution prepared in (1) is injected into a GPC measurement apparatus described below, and elution is conducted for 28 minutes, while the elution time of material detected in the vicinity of the UV wavelength $\lambda=280$ nm is measured. (Measurement Apparatus) Using a GPC measurement apparatus (brand name: "GPC System 11", manufactured by Shodex) equipped with a guard column (brand name: "KF-G", manufactured by Shodex) and three separation columns (brand name: "KF-801", column size: 8 μm (diameter)×300 mm (length), packing material: styrene-divinylbenzene copolymer with a particle size of 6 μm, manufactured by Shodex), and using an oven to set the separation column temperature to 40° C., tetrahydrofuran (THF) eluent was injected into the apparatus at a rate of 1.0 ml/minute.

Furthermore, the degree of distribution [Mw/number average molecular weight (Mn)] of the fractionated resin is preferably no more than 3.0, and most preferably within a range from 2.2 to 2.8. If Mw/Mn exceeds 3.0, then the upper sections of the space pattern (resist pattern) tend to expand, the resolution deteriorates, and the perpendicularity of the cross sectional shape of the resist pattern tends to worsen. This tendency is particularly marked in cases where the focus of the light during exposure is displaced to the plus side (cases where the focus is displaced toward the bottom side of the resist film), and causes a deterioration in the depth of focus range characteristics.

The component (A) is preferably a resin comprising a structural unit of the general formula (a-1) described above; at least one type of structural unit selected from a group consisting of structural units of the aforementioned general formulas (a-2) and (a-3); and at least one type of structural unit selected from a group consisting of structural units of the aforementioned general formulas (a-4) and (a-5). By using this type of resin, a resist pattern with excellent heat resistance and a high aspect ratio with a width of no more than 0.8 μm can be formed with good perpendicularity under thick film conditions of at least 3 μm, and particularly from 6 to 8 μm. Of these resins, those that comprise structural units represented by the general formulas (a-1), (a-2) and (a-4) are particularly preferred as they display excellent levels of sensitivity, resolution, and perpendicularity of the resist pattern cross sectional shape.

Furthermore in the component (A), of the total quantity of phenol based structural units, structural units of the aforementioned general formula (a-1) preferably account for 25 to 55 mol %, the structural unit or units selected from the group consisting of structural units of the aforementioned general formulas (a-2) and (a-3) preferably account for 15 to 45 mol %, and the structural unit or units selected from the group consisting of structural units of the aforementioned general formulas (a-4) and (a-5) preferably account for 15 to 45 mol %. If the quantity of structural units of the general formula (a-1) is less than 25 mol %, then the sensitivity and heat resistance tend to deteriorate, whereas if the quantity exceeds 55 mol %, film thinning tends to become more of a problem. Furthermore, if the quantity of the structural unit or units selected from the group consisting of structural units of the aforementioned general formulas (a-2) and (a-3) is less than 15 mol %, then the resolution tends to deteriorate, whereas if the quantity exceeds 45 mol %, the sensitivity and the heat resistance tend to deteriorate, and scum tends to develop. Furthermore, if the quantity of the structural unit or units selected from the group consisting of structural units of the aforementioned general formulas (a-4) and (a-5) is less than 15 mol %, then the perpendicularity of the resist pattern cross sectional shape and the heat resistance tend to deteriorate, whereas if the quantity exceeds 45 mol %, the sensitivity tends to worsen considerably.

In the component (A), the proportion of the hydrogen atoms of the phenolic hydroxyl groups substituted with 1,2-naphthoquinonediazidesulfonyl groups, in other words the reaction rate from the esterification reaction, is preferably within a range from 2 to 10 mol %, and even more preferably from 3 to 7 mol %, and most preferably from 3 to 5 mol %. If this reaction rate is less than 2 mol %, then film thinning of the unexposed portions tends to increase, causing an undesirable increase in the danger of expansion of the upper sections of the space pattern, whereas if the rate exceeds 10 mol %, the transmittance of i-line radiation etc. falls, causing a marked deterioration in sensitivity, and an expansion of the upper sections of the space pattern, which result in an undesirable deterioration in the perpendicularity of the cross sectional shape of the pattern.

<Component (B)>

The component (B) is a dissolution promoter comprising at least one compound selected from a group consisting of compounds represented by the aforementioned general formulas (b-1) and (b-11).

Normally, when a dissolution promoter is added the heat resistance of the resist tends to deteriorate markedly, but by combining the component (B) with the component (A) described above, the resulting positive photoresist composition can be used to form a resist pattern that displays excellent resolution and perpendicularity of the cross sectional shape. Furthermore, when (b-1) is combined with the component (A), the reduction in the heat resistance of the resulting resist pattern of the present invention is minimal, and solubility is excellent, meaning the developing time can be favorably shortened. Furthermore, when (b-11) is combined with the component (A), then when the resulting resist composition is used for forming a pattern, a favorable exposure margin can be achieved. These effects are particularly marked under thick film conditions of at least 3 µm.

In the general formula (b-1), $R^1$ to $R^9$ each represent, independently, a hydrogen atom, an alkyl group, a halogen atom, or a hydroxyl group. At least one of $R^1$ to $R^9$ must be a hydroxyl group, and in a preferred configuration, at least one of $R^1$ to $R^4$ and at least one of $R^5$ to $R^9$ are hydroxyl groups. The alkyl groups of $R^1$ to $R^9$ may be either straight chain or branched groups, but preferably contain from 1 to 5 carbon atoms, and even more preferably from 1 to 3 carbon atoms.

$R^{10}$ to $R^{15}$ each represent, independently, a hydrogen atom, an alkyl group, an alkenyl group, a cycloalkyl group or an aryl group. The alkyl groups of $R^{10}$ to $R^{15}$ may be either straight chain or branched groups, but are preferably alkyl groups of 1 to 10 carbon atoms. The alkenyl groups are preferably alkenyl groups of 1 to 4 carbon atoms.

The greater the quantity of hydroxyl groups, or the less bulky the groups $R^1$ to $R^{15}$ are, the greater the dissolution promotion effect of the component (b-1) becomes. Accordingly, the nature of the groups $R^1$ to $R^{15}$ should be determined with due consideration to the alkali solubility of the component (A), so that the alkali solubility of the product positive photoresist composition can be adjusted by increasing the dissolution promotion effect of (b-1) in the case of a component (A) with poor alkali solubility, and decreasing the dissolution promotion effect of (b-1) in the case of a component (A) with good alkali solubility.

Specific examples of the compound (b-1) include the compounds represented by the formula (b-2) shown below.

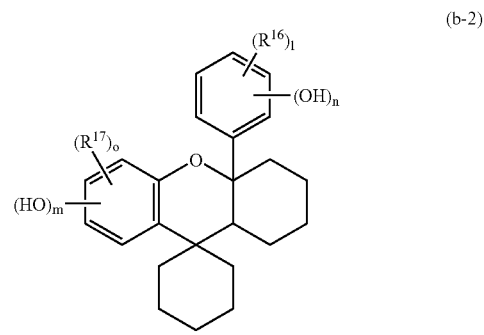

(b-2)

In this formula, $R^{16}$ and $R^{17}$ each represent, independently, an alkyl group. These alkyl groups may be either straight chain or branched groups, but preferably contain from 1 to 5 carbon atoms, and even more preferably from 1 to 3 carbon atoms.

m and n each represent an integer from 1 to 3, and preferably from 1 to 2.

l and o each represent either 0, or an integer from 1 to 3.

More specific examples of the compound (b-1) include the compounds represented by the formulas (b-3) and (b-4) shown below.

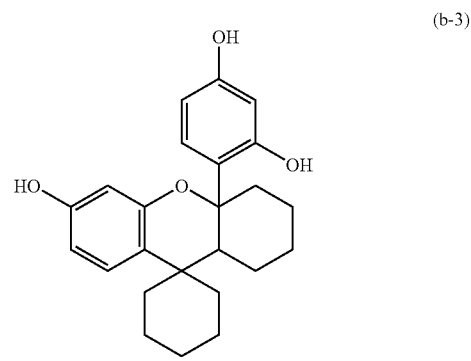

(b-3)

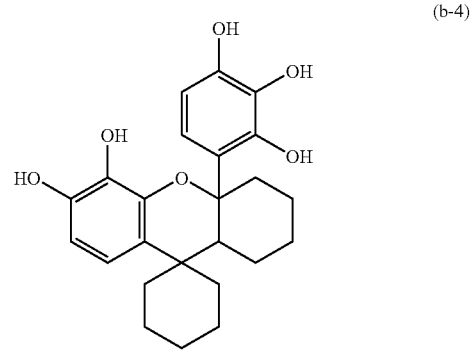

(b-4)

In the general formula (b-1), $R^{41}$ to $R^{43}$ each represent, independently, a lower alkyl group (which may be either a straight chain or a branched group, but preferably contains from 1 to 5 carbon atoms, and even more preferably from 1 to 3 carbon atoms), a cycloalkyl group (preferably of 5 to 7 carbon atoms), or a lower alkoxy group (which may be either a straight chain or a branched group, but preferably contains from 1 to 5 carbon atoms, and even more preferably from 1 to 3 carbon atoms). The less the degree of substitution with $R^{41}$ to $R^{43}$, or the less bulky the groups $R^{41}$ to $R^{43}$ are, the greater the dissolution promotion effect of the component (B) becomes. Accordingly, the existence of the groups $R^{41}$ to $R^{43}$ and the nature of those groups $R^{41}$ to $R^{43}$ should be determined with due consideration to the alkali solubility of the component (A), so that the alkali solubility of the product positive photoresist composition can be adjusted by increasing the dissolution promotion effect of the component (B) in the case of a component (A) with poor alkali solubility, and decreasing the dissolution promotion effect of the component (B) in the case of a component (A) with good alkali solubility.

p and q each represent an integer from 1 to 3, and preferably from 1 to 2.

r, s and t each represent either 0, or an integer from 1 to 3. The smaller the values for r, s and t are, the greater the dissolution promotion effect of the component (B) becomes, and consequently the values of r, s and t should be selected with due consideration to the alkali solubility of the component (A), as described above.

Specific examples of the compound (b-11) include the compounds represented by the formulas (VII) to (XI) shown below.

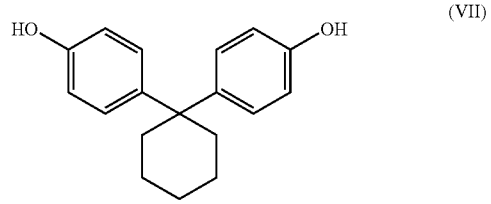

(VII)

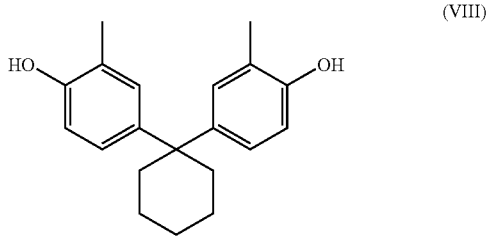

(VIII)

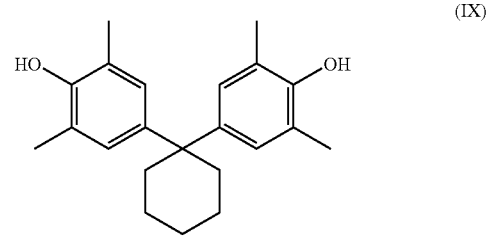

(IX)

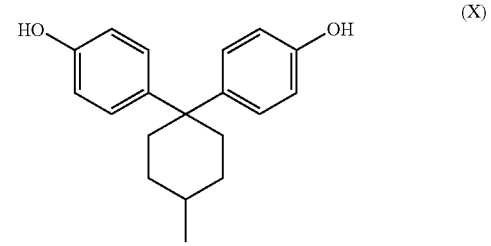

(X)

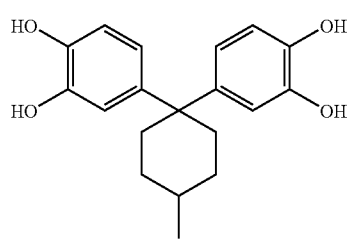

(XI)

The component (B) may use either a single compound, or a combination of two or more different compounds. By using a combination of (b-1) and (b-11) as the component (B), the resolution can be further improved without any significant fall in the heat resistance of the resist.

The quantity of the component (B), relative to the component (A), is preferably within a range from 3 to 30% by weight, and preferably 5 to 20% by weight. In those cases where both (b-1)) and (b-11) are used as the component (B), the combined quantity of these two compounds is preferably within a range from 10 to 40% by weight. Ensuring a quantity within the above range enables the effects of the present invention to be favorably manifested.

<Component (C)>

A positive photoresist composition of the present invention preferably also comprises a photosensitizer as a component (C), depending on the film thickness. Particularly in the case of resist pattern formation under comparatively thinner film thickness conditions of no more than 4 μm, and particularly in the vicinity of 3 μm, the addition of the component (C) reduces deterioration of the resist pattern caused by reflections off the substrate, and particularly off substrates with level differences.

The reason for this observation is that under these comparatively thinner film thickness conditions, the light absorption effect offered by the film thickness does not manifest adequately, meaning the resist pattern is affected by strong reflections off the substrate, and the added photosensitizer supplements the light absorption effect.

A similar effect can also be achieved by raising the reaction rate of the 1,2-naphthoquinonediazidesulfonyl groups derived from the component (A) in the resist, thereby reducing the effect of reflections from the substrate surface, although this causes reductions in both the sensitivity and the resolution, meaning it is not appropriate in those fields where high levels of resolution and sensitivity are required.

In contrast, by adding a component (C), deterioration of the resist pattern caused by reflections off the substrate can be reduced with no loss of sensitivity or resolution.

Accordingly, in the case of applications in which the film thickness is within a range from 4 to 3 μm, the photoresist composition preferably also comprises a component (C).

Examples of the component (C) include naphthoquinonediazide esterification products. There are no particular restrictions on these naphthoquinonediazide esterification products, and either one, or two or more, of those compounds typically used as photosensitizers in positive photoresist compositions can be used.

Of such compounds, esterification products of a naphthoquinonediazidesulfonic acid compound and a phenol compound represented by a general formula (c-1) shown below are preferred.

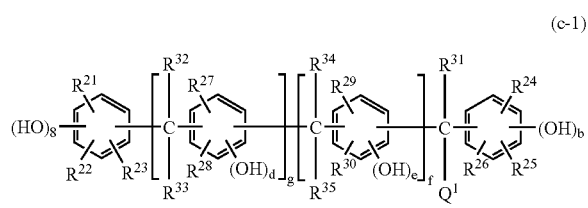

[wherein, $R^{21}$ to $R^{30}$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms; $R^{32}$ to $R^{35}$ each represent, independently, a hydrogen atom, or an alkyl group of 1 to 6 carbon atoms; $R^{31}$ can be either a hydrogen atom or an alkyl group of 1 to 6 carbon atoms, and in such cases, $Q^1$ is either a hydrogen atom, an alkyl group of 1 to 6 carbon atoms, or a residue represented by a chemical formula (c-2) shown below:

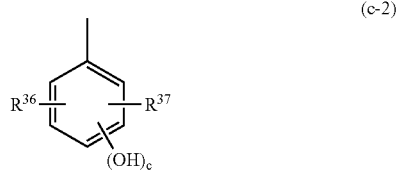

(wherein, $R^{36}$ and $R^{37}$ each represent, independently, a hydrogen atom, a halogen atom, an alkyl group of 1 to 6 carbon atoms, an alkoxy group of 1 to 6 carbon atoms, or a cycloalkyl group of 3 to 6 carbon atoms; and c represents an integer from 1 to 3), or alternatively, $Q^1$ can be bonded to the terminal of $R^{31}$, and in such cases, $Q^1$ and $R^{31}$, together with carbon atoms between $Q^1$ and $R^{31}$, form a cycloalkyl group of 3 to 6 carbon atoms; a and b each represent an integer from 1 to 3; and d and e each represent an integer from 0 to 3; although when a, b, d or e is 3, then $R^{23}$, $R^{26}$, $R^{28}$ or $R^{30}$ respectively do not exist; and f and g represent integers such that f+g is from 0 to 3]

In those cases where $Q^1$, together with $R^{31}$ and the carbon atoms between $Q^1$ and $R^{31}$, forms a cycloalkyl group of 3 to 6 carbon atoms, $Q^1$ and $R^{31}$ are bonded together and form an alkylene group of 2 to 5 carbon atoms.

Of the above compounds, phenol compounds represented by the formula (c-3) shown below are preferred.

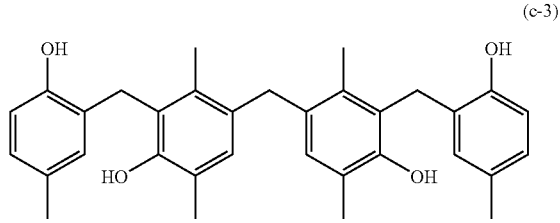

Furthermore, examples of phenol compounds corresponding with the general formula (c-1) other than the phenol compounds of the formula (c-3) include:

tris-phenol type compounds such as tris(4-hydroxyphenyl) methane, bis(4-hydroxy-3-methylphenyl)-2-hydroxyphenylmethane, bis(4-hydroxy-2,3,5-trimethylphenyl)-2-hydroxyphenylmethane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5 dimethylphenyl)-4-hydroxyphenylmethane, bis (4-hydroxy-2,5-dimethylphenyl)-3-hydroxyphenylmethane, bis(4-hydroxy-2,5-dimethylphenyl)-2-hydroxyphenyl-methane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis (5-cyclohexyl-4-hydroxy-2-methylphenyl)-4-hydroxyphenylmethane, bis(5-cyclohexyl-4-hydroxy-2-methylphenyl)-3-hydroxyphenylmethane, bis(5-cyclohexyl-4-hydroxy-2-methylphenyl)-2-hydroxyphenylmethane, and bis(5-cyclohexyl-4-hydroxy-2-methylphenyl)-3,4-dihydroxyphenylmethane;

linear trinuclear phenol compounds such as 2,4-bis(3,5-dimethyl-4-hydroxybenzyl)-5-hydroxyphenol, and 2,6-bis(2,5-dimethyl-4-hydroxybenzyl)-4-methylphenol;

linear tetranuclear phenol compounds such as 1,1-bis[3-(2-hydroxy-5-methylbenzyl)-4-hydroxy-5-cyclohexylphenyl]isopropane, bis[2,5-dimethyl-3-(4-hydroxy-5-methylbenzyl)-4-hydroxyphenyl]methane, bis [2,5-dimethyl-3-(4-hydroxybenzyl)-4-hydroxyphenyl]methane, bis[3-(3,5-dimethyl-4-hydroxybenzyl)-4-hydroxy-5-methylphenyl] methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl] methane, bis[2-hydroxy-3-(3,5-dimethyl-4-hydroxybenzyl)-5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, and bis[2,5-dimethyl-3-(2-hydroxy-5-methylbenzyl)-4-hydroxyphenyl]methane;

linear polyphenol compounds including linear pentanuclear phenol compounds such as 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, and 2,6-bis[2,5-dimethyl-3-(2-hydroxy-5-methylbenzyl)-4-hydroxybenzyl]-4-methylphenol;

bisphenol type compounds such as bis(2,3,4-trihydroxyphenyl)methane, bis(2,4-dihydroxyphenyl)methane, 2,3,4-trihydroxyphenyl-4'-hydroxyphenylmethane, 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, 2-(3-fluoro-4-hydroxyphenyl)-2-(3'-fluoro-4'-hydroxyphenyl)propane, 2-(2,4-dihydroxyphenyl)-2-(4'-hydroxyphenyl)propane, 2-(2,3,4-trihydroxyphenyl)-2-(4'-hydroxyphenyl)propane, and 2-(2,3,4-trihydroxyphenyl)-2-(4'-hydroxy-3',5'-dimethylphenyl)propane;

polynuclear branched compounds such as 1-[1-(4-hydroxyphenyl)isopropyl]-4-[1,1-bis(4-hydroxyphenyl)ethyl]benzene, and 1-[1-(3-methyl-4-hydroxyphenyl)isopropyl]-4-[1,1-bis(3-methyl-4-hydroxyphenyl)ethyl]benzene; and condensation type phenol compounds such as 1,1-bis(4-hydroxyphenyl)cyclohexane.

These compounds can be used singularly, or in combinations of two or more different compounds.

The naphthoquinonediazidesulfonic acid esterification of a portion of the hydrogen atoms of all the phenolic hydroxyl groups of the compound represented by the above general formula (c-1) can be performed using normal methods.

For example, the esterification product can be obtained by condensing naphthoquinonediazidesulfonyl chloride with the compound represented by the general formula (c-1).

Specifically, predetermined quantities of the compound represented by the general formula (c-1) and naphthoquinone-1,2-diazide-4 (or -5)-sulfonyl chloride are dissolved in an organic solvent such as dioxane, n-methylpyrrolidone, dimethylacetamide or tetrahydrofuran, one or more basic catalysts such as triethylamine, triethanolamine, pyridine, an alkali carbonate or an alkali hydrogen carbonate are then added and reacted, and the resulting product is washed in water and dried to yield the final product.

As the component (C), other naphthoquinonediazide esterification products not among the preferred naphthoquinonediazide esterification products listed above can also be used, and for example, the products of esterification reactions between phenol compounds such as polyhydroxybenzophenone or gallic acid and a naphthoquinonediazidesulfonic acid compound can be used.

From the viewpoint of achieving the maximum effect from the present invention, the quantity used of these other naphthoquinonediazide esterification products is typically no more than 80% by weight, and preferably no more than 50% by weight, of the component (C).

The quantity of the component (C) within the positive photoresist composition, relative to the combined quantity of the component (A) and the component (B), is typically within a range from 1 to 30% by weight, and preferably from 2 to 10% by weight.

If the quantity of the photosensitizer (the component (C)) is less than the lower limit listed above, then the desired effects cannot be obtained, whereas if the quantity exceeds the upper limit, the sensitivity and the perpendicularity of the cross sectional shape deteriorate, making it difficult to obtain an image that is faithful to the pattern.

<Other Components>

Where necessary adhesion improvement agents for improving adhesion to the substrate, sensitizers, high boiling point organic solvents, or a variety of other additives typically used in this field may also be added to a positive photoresist composition of the present invention.

Adhesion Improvement Agents

Examples of adhesion improvement agents include those adhesion improvement agents disclosed in Japanese Unexamined Patent Application, First Publication No. Sho 62-262043 and Japanese Unexamined Patent Application, First Publication No. Hei 11-223937, and specific examples include 6-methyl-8-hydroxyquinoline, 6-ethyl-8-hydroxyquinoline, 5-methyl-8-hydroxyquinoline, 8-hydroxyquinoline, 8-acetyloxyquinoline, 4-hydroxypteridine, 2,4-dihydroxypteridine, 4-hydroxypteridine-2-sulfonic acid, 2-ethyl-4-hydroxypteridine, 2-methyl-4-hydroxypteridine, 1,10-phenanthroline, 5,6-dimethyl-1,10-phenanthroline, 3,8-dimethyl-1,10-phenanthroline, 3,8-dihydroxy-1,10-phenanthroline, 5-carboxy-1,10-phenanthroline, 5,6-dihydroxy-1,10-phenanthroline, 1,10-phenanthroline-5-sulfonic acid, 4,4'-dimethyl-2,2'-bipyridyl, 2,2'-bipyridyl, 2,2'-bipyridyl-5-carboxylic acid, 5,5'-dichloro-2,2'-bipyridyl, 3,3'-dihydroxy-2,2'-bipyridyl, and 3,3'-dimercapto-2,2'-bipyridyl.

Furthermore, by incorporating an aromatic heterocyclic compound which contains, within the ring structure, at least one of the linkages represented by the general formulas (e-1) and (e-2) shown below, and at least one linkage represented by the general formula (e-3) shown below, the adhesion of the positive photoresist composition to the substrate can be improved markedly.

wherein, $R^{44}$ represents a hydrogen atom or an alkyl group of 1 to 3 carbon atoms.

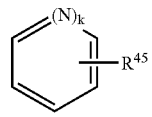

wherein, $R^{45}$ represents a hydroxyl group, or a straight chain or branched alkyl group of 1 to 5 carbon atoms containing a hydroxyl group substituents.

Examples of the aforementioned heterocyclic compound include compounds with a 5-membered ring skeleton with one nitrogen atom such as the indole based compounds, indoline based compounds and indigo based compounds disclosed on pp. 362 to 401 of "Organic Compounds Structural Formula Index" (published by Maruzen (Ltd.), 20 Dec. 1977); compounds with a 6-membered ring skeleton with one nitrogen atom such as pyridine based compounds, quinoline based compounds, hydroquinoline based compounds, isoquinoline based compounds, acridine based compounds, benzoquinoline based compounds, naphthoquinoline based compounds, and phenanthroline based compounds; compounds with a 5-membered ring skeleton with two nitrogen atoms such as pyrazole based compounds, imidazole based compounds, imidazoline based compounds, and benzoimidazole based compounds; compounds with a 6-membered ring skeleton with two nitrogen atoms such as diazine based compounds, hydropyridine based compounds, benzodiazine based compounds, and dibenzodiazine based compounds; compounds with a 5-membered ring skeleton with three nitrogen atoms such as triazole based compounds and benzotriazole based compounds; compounds with a 6-membered ring skeleton with three nitrogen atoms such as triazine based compounds; compounds with a 5-membered ring skeleton with four nitrogen atoms such as tetrazole and pentetrazole; compounds with a 6-membered ring skeleton with four nitrogen atoms such as 1,2,4,5-tetrazine; as well as other compounds such as purine based compounds, pteridine based compounds, alloxazine based compounds, and 2H-pyrrole. Of these, compounds represented by the general formula (e-4) shown below are preferred as they suppress the generation of scum, and enable the provision of a positive photoresist composition with excellent adhesion to the substrate. 2-(2-hydroxyethyl)pyridine is particularly preferred.

wherein, k represents an integer from 1 to 3, and $R^{45}$ is as defined above.

The quantity added of the adhesion improvement agent is typically within a range from 0.1 to 1.0% by weight, and preferably from 0.2 to 0.7% by weight relative to the combined quantity of the component (A) and the component (B), and if added, the component (C) and the component (D). If the quantity is less than 0.1% by weight, then the improvement in the adhesion of the positive photoresist composition to the substrate is inadequate, whereas if the quantity exceeds 1.0% by weight, then the resolution deteriorates and the upper sections of the space pattern tend to expand, and furthermore, a small amount of undesirable scum also develops on the substrate following developing.

High Boiling Point Solvent

Furthermore in the present invention, by adding an optional organic solvent or solvents selected from a group consisting of high boiling point organic solvents with a boiling point of 200 to 350° C., the bulk effect of the resist film, namely bias within the film density, can be reduced, meaning that even in those cases when the positive photoresist composition is used to form a thick resist film on the surface of a substrate with level differences, a resist pattern with excellent perpendicularity can still be formed. Furthermore, a favorable resist pattern can be formed regardless of the conditions (heating time, heating device and the like) for the prebake treatment and the PEB (post exposure baking) treatment.

Examples of the above high boiling point organic solvents include benzyl acetate, isoamyl salicylate, methyl salicylate, benzyl salicylate, diethyl phthalate, dibutyl phthalate, dimethyl phthalate, y-butyrolactone, ethyl benzoate, butyl benzoate, propyl benzoate, benzyl benzoate, ethylene glycol monophenyl ether, ethylene glycol monohexyl ether, 1,3-octylene glycol, diethylene glycol, diethylene glycol diacetate, diethylene glycol dibutyl ether, diethylene glycol monoethyl ether, diethylene glycol monoethyl ether acetate, diethylene glycol monobutyl ether, diethylene glycol monobutyl ether acetate, dipropylene glycol, dipropylene glycol monobutyl ether, triethylene glycol, triethylene glycol di-2-ethyl butyrate, triethylene glycol dimethyl ether, triethylene glycol monoethyl ether, triethylene glycol monomethyl ether, tripropylene glycol, tripropylene glycol monomethyl ether, 2-ethylhexanoic acid, caprylic acid, caproic acid, catechol, octylphenol, and N-methylpyrrolidone. These organic solvents may be used singularly, or in combinations of two or more different solvents. Of the above solvents, those with a boiling point within the range from 250 to 350° C. are preferred, and benzyl salicylate is particularly desirable. The quantity added of the high boiling point organic solvent is typically within a range from 3 to 15% by weight, and preferably from 6 to 12% by weight relative to the combined quantity of the component (A) and the component (B), and if added, the component (C) and the component (D). If the quantity is less than 3% by weight, then the effect of the solvent in suppressing the above phenomenon is limited, whereas if the quantity exceeds 15% by weight, then the upper sections of the space pattern tend to expand, causing an undesirable deterioration in the perpendicularity of the cross sectional shape.

Other Additive Components

In order to further improve the resolution, the exposure margin and the film residual rate, the positive photoresist composition of the present invention may further comprise from approximately 0.01 to 10% by weight of each of p-toluenesulfonyl chloride (PTSC), 4,4'-bis(diethylamino)benzophenone, 1,4-bis[1-(2-methyl-4-hydroxy-5-cyclohexylphenyl)isopropyl]benzene, and/or 1,3-bis[1-(2-methyl-4-hydroxy-5-cyclohexylphenyl)isopropyl]benzene.

Furthermore, where necessary, the positive photoresist composition of the present invention may also comprise any of a variety of co-soluble additives, provided they are added in quantities that do not impair the objects of the invention. Examples of such additives include ultraviolet absorbers for preventing halation such as 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4,4'-diethylaminoazobenzene and curcumin; and surfactants for preventing striation including fluorine based surfactants such as Fluorad FC-430 and FC-431 (brand names, manufactured by 3M Japan Co., Ltd.), EFTOP EF122A, EF122B, EF122C and EF126 (brand names, manufactured by Tohkem Products Corporation) and Megafac R-08 (manufactured by Dainippon Ink and Chemicals, Inc.).

The positive photoresist composition of the present invention is preferably used as a solution prepared by dissolving the component (A) and the component (B), as well as the component (C) and other additional components added according to need, in an appropriate solvent. Examples of suitable solvents include those solvents conventionally used in positive photoresist compositions, including ketones such as acetone, methyl ethyl ketone, cyclohexanone, methyl isoamyl ketone, and 2-heptanone; polyhydric alcohols and derivatives thereof such as ethylene glycol, propylene glycol, diethylene glycol, ethylene glycol monoacetate, propylene glycol monoacetate, diethylene glycol monoacetate, or the monomethyl ethers, monoethyl ethers, monopropyl ethers, monobutyl ethers or monophenyl ethers of these compounds; cyclic ethers such as dioxane; and esters such as ethyl lactate, methyl acetate, ethyl acetate, butyl acetate, methylpyruvate, ethyl pyruvate, methyl methoxypropionate, and ethyl ethoxypropionate. These solvents can be used singularly, or in combinations of two or more different solvents. Of the above solvents, ketones such as acetone, methyl ethyl ketone, cyclohexanone, methyl isoamyl ketone, and 2-heptanone; and esters such as ethyl lactate, methyl acetate, ethyl acetate, butyl acetate, methylpyruvate, ethyl pyruvate, methyl methoxypropionate, and ethyl ethoxypropionate are preferred. Although single solvents may be used, combinations of two or more solvents may also be used in order to achieve favorable film formation characteristics under thick film conditions of 3 μm or more, particularly 3 to 10 μm.

The quantity used of such solvents, for example in the case in which spin coating is used to form a thick film of at least 3 μm, is preferably sufficient to generate a solid fraction concentration within the positive photoresist composition within a range from 30 to 65% by weight. If the solid fraction concentration is less than 30% by weight, then achieving a thick film of at least 3 μm becomes difficult, whereas if the concentration exceeds 65% by weight, the fluidity of the composition worsens significantly, making handling difficult, and also making it difficult to obtain a uniform resist film using spin coating methods.

Preparation of a positive photoresist composition according to the present invention may be conducted simply by mixing and stirring together each of the components described above using normal methods, or if necessary, by dispersion and mixing using a dispersion device such as a dissolver, a homogenizer or a three roll mill. Furthermore, following mixing of the components, the composition may also be filtered using a mesh or a membrane filter or the like.

A positive photoresist composition of the present invention is ideal for forming a thick film photoresist layer with a film thickness of 3 to 30 μm, and preferably from 3 to 20 μm, and even more preferably from 3 to 10 μm, on a support.

(Method of Forming a Resist Pattern)

As follows is a description of a preferred example of a method of forming a resist pattern according to the present invention.

First, a solution prepared by dissolving the component (A) and the component (B), and where required the component (C) and any other additional components, in an aforementioned appropriate solvent is applied to the surface of a substrate formed from a material such as Si, an Fe—Ni alloy (permalloy) or Cu using a spinner or the like, and is then dried to form a photosensitive layer. This photosensitive layer is then exposed through a desired mask pattern, using a light source that emits light with a wavelength in the vicinity of 365 nm, such as a low pressure mercury lamp, a high pressure mercury lamp or an ultra high pressure mercury lamp. Where required, a PEB (post exposure baking) treatment is then performed, and the exposed portions of the film are then dissolved and removed by immersing the substrate in a developing liquid, for example, an alkaline aqueous solution such as a 1 to 10% by weight aqueous solution of tetramethylammonium hydroxide (TMAH), thus forming an image which is faithful to the mask pattern.

In those cases where a resist pattern with a high aspect ratio with a width of no more than 0.8 μm is formed under thick film conditions of at least 3 μm, and particularly from 6 to 8 μm, a conventional pattern formation method using an acid cross linking material can also be used if required. Examples of such conventional methods include resist pattern formation methods comprising the steps of: forming a film of an acid cross linking material, which causes a cross linking reaction under the action of acid, across the entire surface of the substrate on which the resist pattern has been drawn, conducting heat treatment so that the action of acid diffusing from the resist pattern surface causes cross linking of the acid cross linking material in those portions contacting the resist pattern, and using a developing liquid to remove the acid cross linking material from those areas that have not undergone cross linking, thereby forming a resist pattern with a narrower space width than that of the resist pattern prior to formation of the acid cross linking material film; and resist pattern formation methods comprising the steps of: forming a film of an acid cross linking material, which causes a cross linking reaction under the action of acid, across the entire surface of the substrate on which the resist pattern has been drawn, generating acid at the surface of, or inside, the resist pattern by conducting either selective exposure or complete exposure of the substrate surface using ultraviolet radiation, conducting heat treatment so that the action of acid diffusing from the resist pattern surface causes cross linking of the acid cross linking material in those portions contacting the resist pattern, and using a developing liquid to remove the acid cross linking material from those areas that have not undergone cross linking, thereby forming a resist pattern with a narrower space width than that of the resist pattern prior to formation of the acid cross linking material film. There are no particular restrictions on the acid cross linking material and the developing liquid used, and suitable examples include the materials disclosed in Japanese Unexamined Patent Application, First Publication No. Hei 11-204399.

A resist pattern produced in the manner described above displays a high level of resolution and excellent perpendicularity. Furthermore, the exposure margin during formation of the resist pattern is large, and control of the dimensions relative to the exposure dose is simple.

EXAMPLES

[Evaluations at a Resist Film Thickness of 7 μm]

As follows is a more detailed description of the present invention at a resist film thickness of 7 μm, using a series of examples and comparative examples. The various properties of the positive photoresist compositions were evaluated in the manner described below.

(1) Evaluation of Cross Sectional Shape

A sample was applied with a spinner to the surface of a substrate that had been treated with hexamethyldisilazane (HMDS), and was then dried on a hotplate at 110° C. for 90 seconds, thus forming a resist film with a film thickness of 7.0 μm.

Subsequently, the film was exposed for 1.5 seconds through a mask with a desired light shielding pattern, using a reduction projection exposure apparatus NSR-2005i10D (manufactured by Nikon Corporation, NA=0.50), so that a space line with mask dimensions of 0.50 μm was reproduced at 0.80 μm, and was then subjected to PEB (post exposure baking) treatment at 110° C. for 90 seconds.

As the developing operation, a 2.38% by weight aqueous solution of tetramethylammonium hydroxide (TMAH) at 23° C. was then applied to the substrate surface, and after 60 seconds contact, was removed by rotating the spinner.

This developing operation was repeated as many times as was necessary, and the film was then washed with water for 30 seconds and dried. The cross sectional shape when a space line from the mask with a width of 0.5 μm was formed at 0.80 μm was viewed via a SEM (scanning electron microscope) photograph, and the ratio of the width (B) at the bottom of the pattern relative to the width (T) at a height 3.5 μm from the bottom of the pattern in the thickness direction, that is the ratio (B/T), was calculated and recorded as "A" for values $0.85 \leq (B/T) \leq 1.0$, "B" for $0.70 \leq (B/T) < 0.85$, and "C" for values $(B/T) < 7.0$ or $1.0 < (B/T)$. Furthermore, those films for which a space pattern with mask dimensions of 0.50 μm could not be reproduced at $\leq 0.80$ μm, regardless of how the exposure dose was adjusted, were recorded as "D".

(2) Evaluation of Developing Rate

The number of repetitions required of the developing operation, comprising applying the 2.38% by weight aqueous solution of tetramethylammonium hydroxide (TMAH) to the substrate surface at 23° C., and following 60 seconds contact, removing the developing solution by rotating the spinner, was noted, and samples requiring 4 repetitions were evaluated as "A", those requiring 5 repetitions were evaluated as "B", and those requiring 6 or more repetitions were recorded as "C".

(3) Evaluation of Resolution

At EOP (the exposure dose when, using a mask with mask dimensions of 0.50 μm, bias is applied and a space pattern with pattern dimensions of 0.80 μm is formed), the minimum mask dimension (μm) capable of being separated at the bottom portion of the pattern was recorded as the critical resolution. Furthermore, cases in which pattern formation was not possible at $\leq 0.80$ μm were recorded as "C".

(4) Evaluation of Heat Resistance

A sample was applied with a spinner to the surface of a substrate that had been treated with HMDS, and was then dried on a hotplate at 100° C. for 90 seconds, thus forming a resist film with a film thickness of 3.0 μM.

Subsequently, the film was exposed through a mask with mask dimensions of 5 μm (for forming a 5 μm line pattern), using a reduction projection exposure apparatus NSR- 2005i10D (manufactured by Nikon Corporation, NA=0.50), so that a 5 μm line pattern was formed, and the film was then subjected to PEB treatment at 100° C. for 90 seconds.

As the developing operation, a 2.38% by weight aqueous solution of tetramethylammonium hydroxide (TMAH) at 23° C. was then applied to the substrate surface, and after 60 seconds contact, was removed by rotating the spinner.

This developing operation was repeated twice, the film was then washed with water for 30 seconds and dried, and the resulting substrate with 5 μm line pattern thereon was subjected to heat treatment on a hotplate at 130° C. for 600 seconds.

The cross sectional shape of the 5 μm line pattern was then viewed via a SEM (scanning electron microscope) photograph, and the angle between the substrate interface and a straight line connecting the point of intersection (point (a) in FIG. 1) between the substrate interface and the side wall of the resist pattern, and the corner (point (b) in FIG. 1) at the top of the resist pattern was termed θ. Patterns for which θ>80° were recorded as "A", patterns for which 80°≧θ and in which an angle still existed at the top of the resist pattern were recorded as "B", and patterns in which an angle no longer existed at the top of the resist pattern, making measurement impossible, were recorded as "C".

(5) Evaluation of Exposure Margin 1

The ratio (R) between EOP (the exposure dose when, using a mask with mask dimensions of 0.50 μm, bias is applied and a space pattern with pattern dimensions of 0.80 μm is formed) and ETH (the exposure dose required to remove the resist layer to the bottom thereof from the whole surface or large surface area portion) was determined, and R<2.5 was recorded as "C", 2.5≦R<3.0 was recorded as "B", and 3.0<R was recorded as "A".

(6) Evaluation of Exposure Margin 2

The difference (D) between EOP (the exposure dose when, using a mask with mask dimensions of 0.50 μm, bias is applied and a space pattern with pattern dimensions of 0.80 μm is formed) and Es (the exposure dose when, using a mask with mask dimensions of 0.50 μm, the bottom portion of the space pattern begins to separate) was calculated, and D<100 ms was recorded as "C", 100 ms≦D<200 ms was recorded as "B", and 200 ms≦D was recorded as "A".

Synthetic Example 1

Synthesis of Novolak Resin 1 (m/p/235TMP=35/40/25, Mw=4200, Mw/Mn=2.5, Substitution rate=3.8 mol %)

1. Control of the molecular weight (Mw) and the degree of distribution (Mw/Mn) using a fractionation operation 125 g of a condensation polymerization product (Mw=2600, Mw/Mn=3.3, low molecular weight fraction of trimer level or below=10.8% by weight) produced by a dehydration condensation reaction between m-cresol, p-cresol and 2,3,5-trimethylphenol (molar ratio 35:40:25), and formalin was placed in a 2 liter beaker, and 830 g of methanol was then added and stirred to dissolve the product.

Subsequently, 313 g of pure water was added to generate a precipitate, and this precipitate was collected by filtration, yielding a novolak resin (I) with a controlled molecular weight and degree of distribution (Mw=4300, Mw/Mn=2.5, low molecular weight fraction of trimer level or below=3.5% by weight).

2. Esterification Reaction 50 g of this novolak resin (I), and 4 g (0.015 mols) of 1,2-naphthoquinonediazide-5-sulfonyl chloride were placed in a 1 liter three-neck flask equipped with a thermometer, a stirrer and a dropping funnel. 162 g of dioxane was then added to dissolve the mixture, and 3.0 g (0.030 mols) of triethylamine was added from the dropping funnel. The reaction mixture was then stirred for 1 hour at room temperature to allow the reaction to proceed.

Subsequently, 4.7 g (0.045 mols) of a 35% aqueous hydrochloric acid solution was added, and following stirring for a further 30 minutes at room temperature, the mixture was filtered to yield a red-brown colored liquid.

This liquid was added, with constant stirring, to a 2 liter beaker containing 1 liter of pure water, thus precipitating a product.

The precipitate was collected by filtration, and the thus obtained solid was dissolved in butyl acetate, the solution was concentrated, and then ethyl lactate was added, thus yielding a solution, in a solvent comprising a mixed solution of butyl acetate and ethyl lactate (ratio 2:8), of a novolak resin (II) in which 3.8 mol % of all the phenolic hydroxyl groups had been substituted with 1,2-naphthoquinonediazidesulfonyl groups.

Example 1

| | |
|---|---|
| Component (A): novolak resin (II) from the synthetic example 1 | 100 parts by weight |
| Component (B): the compound of the above formula (b-4) | 18 parts by weight |

The above components were dissolved in 155 parts by weight of a mixed solvent of ethyl lactate and butyl acetate (8:2), and the resulting solution was filtered through a membrane filter with a pore size of 0.1 to 0.2 μm, yielding a positive photoresist composition. The thus prepared positive photoresist composition was evaluated in accordance with (1) to (4) above. The results are shown in Table 1.

Example 2

| | |
|---|---|
| Component (A): novolak resin (II) from the synthetic example 1 | 100 parts by weight |
| Component (B): the compound of the above formula (b-4)/the compound of the above formula (b-12) (a 1/1 by weight mixture) | 18 parts by weight |

The above components were dissolved in 150 parts by weight of a mixed solvent of ethyl lactate and butyl acetate (8:2), and the resulting solution was filtered through a membrane filter with a pore size of 0.1 to 0.2 μm, yielding a positive photoresist composition. The thus prepared positive photoresist composition was evaluated in accordance with (1) to (4) above. The results are shown in Table 1.

Comparative Example 1

With the exception of changing the component (B) of the example 1 to 1-[1-(4-hydroxyphenyl)isopropyl]-4-[1,1-bis(4-hydroxyphenyl)ethyl]benzene, a positive photoresist composition was prepared in the same manner as the example 1. The thus prepared positive photoresist composition was evaluated in accordance with (1) to (4) above. The results are shown in Table 1.

Comparative Example 2

With the exception of changing the component (B) of the example 1 to bis(4-hydroxy-3,5-dimethylphenyl)-2-hydroxyphenylmethane, a positive photoresist composition was prepared in the same manner as the example 1. The thus prepared positive photoresist composition was evaluated in accordance with (1) to (4) above. The results are shown in Table 1.

Comparative Example 3

In the example 1, with the exceptions of replacing the component (A) with the novolak resin (I) as the alkali-soluble resin, and adding, as a photosensitizer, 1-[1-(4-hydroxyphenyl)isopropyl]-4-[1,1-bis(4-hydroxyphenyl)ethyl]benzene in which 2 mol % of the hydrogen atoms of all the phenolic hydroxyl groups had been substituted with 1,2-naphthoquinonediazide-5-sulfonyl groups, a positive photoresist composition was prepared in the same manner as the example 1. The thus prepared positive photoresist composition was evaluated in accordance with (1) to (4) above. The results are shown in Table 1.

TABLE 1

| | Cross sectional shape | Developing rate | Resolution | Heat resistance |
|---|---|---|---|---|
| Example 1 | A | A | 0.50 | A |
| Example 2 | A | A | 0.45 | B |
| Comparative example 1 | B | B | 0.50 | C |
| Comparative example 2 | C | C | 0.50 | C |
| Comparative example 3 | D | B | C | C |

From these results it is evident that the positive photoresist composition of the example 1, comprising a specific component (A) and the compound (b-1), displayed excellent results for all categories, including the cross sectional shape of the side walls of the formed resist pattern (the perpendicularity), the developing rate, the resolution, and the heat resistance. Furthermore, the positive photoresist composition of the example 2, further comprising the compound (b-11), displayed even better resolution.

In contrast, the resist patterns obtained using the positive photoresist compositions of the comparative examples 1 and 2, which used a conventional dissolution promoter instead of the compound (b-1), displayed poorer levels of heat resistance and developing rate than the example 1, and also suffered from inferior perpendicularity of the cross sectional shape.

Furthermore, in the resist pattern obtained using the positive photoresist composition of the comparative example 3, comprising an alkali-soluble resin in which the hydroxyl groups had not been substituted with 1,2-naphthoquinonediazidesulfonyl groups, together with a photosensitizer, instead of the component (A), a space pattern with mask dimensions of 0.50 µm could not be reproduced at ≦0.80 µm regardless of how the exposure dose was adjusted.

Example 3

| | |
|---|---|
| Component (A): novolak resin (II) from the synthetic example 1 | 100 parts by weight |
| Component (B): the compound of the above formula (b-12) | 18 parts by weight |

The above components were dissolved in 155 parts by weight of a mixed solvent of ethyl lactate and butyl acetate (8:2), and the resulting solution was filtered through a membrane filter with a pore size of 0.1 to 0.2 µm, yielding a positive photoresist composition. The thus prepared positive photoresist composition was evaluated in accordance with (1), (3), (5) and (6) above. The results are shown in Table 2.

Comparative Example 4

With the exception of changing the component (B) of the example 3 to 1-[1-(4-hydroxyphenyl)isopropyl]-4-[1,1-bis(4-hydroxyphenyl)ethyl]benzene, a positive photoresist composition was prepared in the same manner as the example 3. The thus prepared positive photoresist composition was evaluated in accordance with (1), (3), (5) and (6) above. The results are shown in Table 2.

Comparative Example 5

With the exception of changing the component (B) of the example 3 to bis(4-hydroxy-3,5-dimethylphenyl)-2-hydroxyphenylmethane, a positive photoresist composition was prepared in the same manner as the example 3. The thus prepared positive photoresist composition was evaluated in accordance with (1), (3), (5) and (6) above. The results are shown in Table 2.

Comparative Example 6

In the example 3, with the exception of replacing the component (A) with the novolak resin (I) as the alkali-soluble resin, and adding, as a photosensitizer, 1-[1-(4-hydroxyphenyl)isopropyl]-4-[1,1-bis(4-hydroxyphenyl)ethyl]benzene in which 2 mol % of the hydrogen atoms of all the phenolic hydroxyl groups had been substituted with 1,2-naphthoquinonediazide-5-sulfonyl groups, a positive photoresist composition was prepared in the same manner as the example 3. The thus prepared positive photoresist composition was evaluated in accordance with (1), (3), (5) and (6) above. The results are shown in Table 2.

TABLE 2

| | Cross sectional shape | Resolution | Exposure margin 1 | Exposure margin 2 |
|---|---|---|---|---|
| Example 3 | A | 0.45 | A | A |
| Comparative example 4 | B | 0.50 | B | C |
| Comparative example 5 | C | 0.50 | C | B |
| Comparative example 6 | D | C | — | A |

From these results it is evident that the resist pattern obtained using the positive photoresist composition of the example 3, comprising a specific component (A) and the compound (b-11), displayed excellent perpendicularity of the pattern side walls and excellent resolution. Furthermore, the exposure margin was also high.

In contrast, the resist patterns obtained using the positive photoresist compositions of the comparative examples 4 and 5, which used a conventional dissolution promoter instead of the compound (b-11), displayed poorer levels of perpendicularity and resolution than the example 3, and also had lower exposure margins.

Furthermore, in the resist pattern obtained using the positive photoresist composition of the comparative example 6, comprising an alkali-soluble resin in which the hydroxyl groups had not been substituted with 1,2-naphthoquinonediazidesulfonyl groups, together with a photosensitizer, instead of the component (A), the perpendicularity and the resolution were extremely poor.

[Evaluations at a Resist Film Thickness of 3 μm]

As follows is a more detailed description of the present invention at a resist film thickness of 3 μm, using a series of examples and comparative examples. The various properties of the positive photoresist compositions were evaluated in the manner described below.

(1) Evaluation of Resolution

A sample was applied with a spinner to the surface of a substrate that had been treated with hexamethyldisilazane (HMDS), and was then dried on a hotplate at 100° C. for 90 seconds, thus forming a resist film with a film thickness of 3.0 μm.

Subsequently, the film was exposed through a mask with a desired light shielding pattern, using a reduction projection exposure apparatus NSR-2005i10D (manufactured by Nikon Corporation, NA=0.50), so that a pattern was produced in accordance with the 1.5 μm L (line)/S (space)=1/1 mask dimensions, and was then subjected to PEB (post exposure baking) treatment at 100° C. for 90 seconds.

As the developing operation, a 2.38% by weight aqueous solution of tetramethylammonium hydroxide (TMAH) at 23° C. was then applied to the substrate surface, and after 60 seconds contact, was removed by rotating the spinner.

This developing operation was repeated twice, and the film was then washed with water for 30 seconds and dried. The thus obtained L/S=1/1 pattern was viewed via a SEM (scanning electron microscope) photograph, and films which displayed no film thinning, and in which the critical mask dimension (M) at which the L/S=1/1 pattern could be resolved was M≦0.6 μm were recorded as "A", and films for which 0.6 μm<M were recorded as "C".

(2) Evaluation of Sensitivity

Exposure and developing were conducted in the same manner as the resolution evaluation, and films in which the exposure time (T) required to achieve a pattern in accordance with the 1.5 μm L (line)/S (space)=1/1 mask dimensions satisfied T<1 second were recorded as "A", whereas films for which 1 second ≦T were recorded as "B".

(3) Evaluation of Resistance to Reflection from the Substrate

With the exception of changing the substrate used in the resolution evaluation to an Al substrate in which a 1 μm level difference pattern had been scored into the surface, exposure and developing were conducted in the same manner as that described for the resolution evaluation. The thus obtained resist pattern was inspected using a SEM (scanning electron microscope) photograph, and under the effect of reflections from the level differences at the substrate surface, those films in which a 1.0 μm L/S 1/1 pattern could still be formed were recorded as "A", whereas those films in which the pattern could not be formed were recorded as "C".

Example 4

| | |
|---|---|
| Component (A): novolak resin (II) from the synthetic example 1 | 100 parts by weight |
| Component (B): the compound of the above formula (b-4) | 18 parts by weight |

-continued

| | |
|---|---|
| Component (C): photosensitizer in which 2 mol % of the hydrogen atoms of all the phenolic hydroxyl groups within the compound of the formula (c-3) have been substituted with 1,2-naphthoquinonediazide-5-sulfonyl groups | 9 parts by weight |

The above components were dissolved in 190 parts by weight of a mixed solvent of ethyl lactate and butyl acetate (8:2), and the resulting solution was filtered through a membrane filter with a pore size of 0.1 to 0.2 μm, yielding a positive photoresist composition.

The thus prepared positive photoresist composition was evaluated in accordance with (1) to (3) above. The results are shown in Table 3.

Comparative Example 7

With the exception of excluding the component (C) from the example 4, a positive photoresist composition was prepared in the same manner as the example 4. The thus prepared positive photoresist composition was evaluated in accordance with (1) to (3) above. The results are shown in Table 3.

Comparative Example 8

With the exception of altering the quantity of the component (C) of the example 4 to 40 parts by weight, a positive photoresist composition was prepared in the same manner as the example 4. The thus prepared positive photoresist composition was evaluated in accordance with (1) to (3) above. The results are shown in Table 3.

TABLE 3

| | Resolution | Sensitivity | Resistance to reflection from substrate |
|---|---|---|---|
| Example 4 | A | A | A |
| Comparative example 7 | A | A | C |
| Comparative example 8 | C | C | — |

Example 5

| | |
|---|---|
| Component (A): novolak resin (II) from the synthetic example 1 | 100 parts by weight |
| Component (B): the compound of the above formula (b-12) | 18 parts by weight |
| Component (C): photosensitizer in which 2 mol % of the hydrogen atoms of all the phenolic hydroxyl groups within the compound of the formula (c-3) have been substituted with 1,2-naphthoquinonediazide-5-sulfonyl groups | 9 parts by weight |

The above components were dissolved in 190 parts by weight of a mixed solvent of ethyl lactate and butyl acetate (8:2), and the resulting solution was filtered through a membrane filter with a pore size of 0.1 to 0.2 μm, yielding a positive photoresist composition.

The thus prepared positive photoresist composition was evaluated in accordance with (1) to (3) above. The results are shown in Table 4.

Comparative Example 9

With the exception of excluding the component (C) from the example 5, a positive photoresist composition was prepared in the same manner as the example 5.

The thus prepared positive photoresist composition was evaluated in accordance with (1) to (3) above. The results are shown in Table 4.

Comparative Example 10

With the exception of altering the quantity of the component (C) of the example 5 to 40 parts by weight, a positive photoresist composition was prepared in the same manner as the example 5.

The thus prepared positive photoresist composition was evaluated in accordance with (1) to (3) above. The results are shown in Table 4.

TABLE 4

|  | Resolution | Sensitivity | Resistance to reflection from substrate |
|---|---|---|---|
| Example 5 | A | A | A |
| Comparative example 9 | A | A | C |
| Comparative example 10 | C | C | — |

From these results it is evident that in the examples 4 and 5, by adding the component (C) to the specified component (A) and component (B), the effect of reflections off the substrate in the case of a comparatively thin film can be reduced without lowering the resolution or sensitivity.

In the comparative examples 7 and 9, the effect of reflections from the substrate could not be suppressed, whereas in the comparative examples 8 and 10, a marked deterioration in both the sensitivity and the resolving power meant that the 1.5 μm L (line)/S (space)=1/1 pattern could not be resolved.

INDUSTRIAL APPLICABILIY

According to the present invention, there are provided positive photoresist compositions, which are capable of forming patterns with excellent resolution, excellent resistance to reflection off the substrate, and excellent perpendicularity, and also offer either superior levels of heat resistance and solubility, or large exposure margins when a resist pattern is formed on a substrate, as well as a method of forming a resist pattern that uses such compositions. Thus, the present invention is extremely useful in the industry.

The invention claimed is:

1. A coated substrate comprising a substrate and a photosensitive layer,
   said photosensitive layer being at least 3 μm in thickness and comprising:
   (A) an alkali-soluble novolak resin having a weight average molecular weight of 1,000 to 50,000, in which a portion of hydrogen atoms of phenolic hydroxyl groups are substituted with 1,2-naphthoquinonediazidesulfonyl groups; and
   (B) a dissolution promoter comprising at least one compound selected from a group consisting of compounds represented by a general formula (b-1) and a general formula (b-11) shown below;

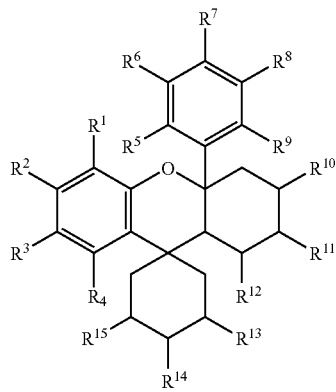

(b-1)

wherein, $R^1$ to $R^9$ each represent, independently, a hydrogen atom, an alkyl group, a halogen atom, or a hydroxyl group, although at least one of $R^1$ to $R^9$ represents a hydroxyl group; and $R^{10}$ to $R^{15}$ each represent, independently, a hydrogen atom, an alkyl group, an alkenyl group, a cycloalkyl group or an aryl group;

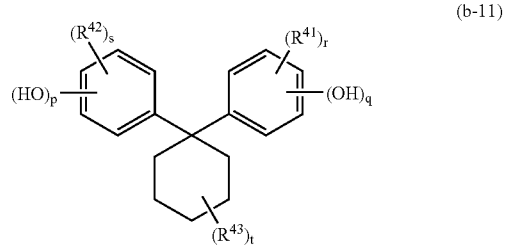

(b-11)

wherein, $R^{41}$ to $R^{43}$ each represent, independently, a lower alkyl group, a cycloalkyl group or a lower alkoxy group; p and q each represent an integer from 1 to 3; and r, s and t each represent either 0, or an integer from 1 to 3.

2. The coated substrate according to claim 1, wherein said component (A) is a fractionated resin in which fractionation treatment has been used to reduce a lower molecular weight fraction to no more than 80% by weight of a value prior to said fractionation.

3. The coated substrate according to claim 1, wherein said photosensitive layer further comprises a photosensitizer (C).

4. The coated substrate according to claim 1, wherein the photosensitive layer comprises both (b-1) and (b-11) as dissolution promoters.

5. The coated substrate according to claim 1, wherein said component (A) has a weight average molecular weight of 2,000 to 20,000.

6. The coated substrate according to claim 3, wherein the quantity of said component (C) within said photosensitive layer, relative to the combined quantity of said component (A) and said component (B) is 30% by weight or less.

7. The coated substrate according to claim 1, wherein the proportion of the hydrogen atoms of the phenolic hydroxyl groups substituted with 1,2-naphthoquinonediazidesulfonyl groups within said component (A) is from 2 to 10 mol %.

8. A method of forming a resist pattern comprising conducting a prebake of a coated substrate of any one of claims 1 to 7, performing selective exposure, and then performing alkali developing to form said resist pattern.

9. The coated substrate according to claim 1, wherein said photosensitive layer is from 6 to 8 μm in thickness.

* * * * *